United States Patent
Wang et al.

(10) Patent No.: US 6,758,949 B2
(45) Date of Patent: Jul. 6, 2004

(54) MAGNETICALLY CONFINED METAL PLASMA SPUTTER SOURCE WITH MAGNETIC CONTROL OF ION AND NEUTRAL DENSITIES

(75) Inventors: Wei D. Wang, San Jose, CA (US); Praburam Gopalraja, San Jose, CA (US); Jianming Fu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 7 days.

(21) Appl. No.: 10/241,114

(22) Filed: Sep. 10, 2002

(65) Prior Publication Data

US 2004/0045811 A1 Mar. 11, 2004

(51) Int. Cl.[7] ............................................... C23C 14/35
(52) U.S. Cl. ............................. 204/192.12; 204/298.06; 204/298.12; 204/298.17
(58) Field of Search ..................... 204/298.06, 298.07, 204/298.02, 298.17, 298.12, 192.12

(56) References Cited

U.S. PATENT DOCUMENTS

| | | | |
|---|---|---|---|
| 3,547,074 A | 12/1970 | Hirschfeld | 118/7 |
| 4,494,005 A | 1/1985 | Shibata et al. | 250/492.2 |
| 4,764,394 A | 8/1988 | Conrad | 427/38 |
| 4,804,879 A | 2/1989 | Fukumoto | 313/361.1 |
| 5,078,848 A | 1/1992 | Anttila et al. | 204/192.38 |
| 5,126,163 A | 6/1992 | Chan | 427/38 |
| 5,178,739 A * | 1/1993 | Barnes et al. | 204/192.12 |
| 5,433,836 A | 7/1995 | Martin et al. | 204/298.41 |
| 5,554,853 A | 9/1996 | Rose | 250/492.21 |
| 5,800,688 A * | 9/1998 | Lantsman et al. | 204/298.11 |
| 5,925,886 A | 7/1999 | Seki et al. | 250/492.21 |
| 6,242,750 B1 | 6/2001 | Takahashi et al. | 250/492.21 |
| 6,306,265 B1 | 10/2001 | Fu et al. | 204/192.12 |
| 6,313,475 B1 | 11/2001 | Renau et al. | 250/492.21 |
| 6,326,631 B1 | 12/2001 | Politiek et al. | 250/492.21 |

OTHER PUBLICATIONS

U.S. patent application Ser. No. 08/854,008, filed May 8, 1997, entitled, "Sustained Self–Sputtering Reactor Having an Increased Density Plasma," by Jianming Fu, et al.

* cited by examiner

*Primary Examiner*—Steven Versteeg
(74) *Attorney, Agent, or Firm*—Law Offices of Robert M. Wallace

(57) ABSTRACT

A metal vapor deposition reactor includes a primary reactor chamber having a primary chamber enclosure comprising a ceiling and side wall. The reactor further includes a secondary reactor chamber having a secondary chamber enclosure and a metal source target within the secondary chamber formed of a metal species to be deposited on said semiconductor wafer. Process gas inlets furnish process gases into a region of the secondary chamber near a working surface of said metal source target. A D.C. power source connected across said metal source target and a conductive portion of said secondary chamber enclosure has sufficient power to support ionization of the process gas near the working surface of the metal source target whereby to form a plasma that sputters metal ions and neutrals from the working surface of the metal source target.

30 Claims, 7 Drawing Sheets

MAGNETICALLY CONFINED METAL PLASMA SPUTTER SOURCE WITH MAGNETIC CONTROL OF ION AND NEUTRAL DENSITIES

BACKGROUND OF THE INVENTION

Microelectronic integrated circuit fabrication involves processes in which thin film layers are deposited and removed. Improvement in performance and speed has been attained in large part by reducing device size so that contact openings, for example, are a few microns in diameter and several microns in depth. Such improvement has also been realized with more complex structures having several layers of circuits and conductors, making the overall structure deeper, requiring contact openings and vias with higher aspect ratios. However, with the current micron-sized geometries and high aspect ratio openings (e.g., aspect ratios of 10), filling contact openings and vias with metal is accomplished using continuous plasma sputtering of a metal target. To our knowledge, other sources, such as carbon arc sources for example, are not generally employed in the processing of sub-micron semiconductor integrated circuits. One problem encountered in metal deposition in a sub-micron high aspect ratio opening is that it is difficult to thoroughly cover the bottom of the hole. This is because the sputtered metal atoms or ions tend to travel in many directions as they propagate toward the target, so that their angle of incidence is generally not parallel with the axis of the high aspect ratio opening. Therefore, many or most of the metal particles hit the side wall before they can reach the bottom of the hole and therefore form a layer on the side wall of the hole that eventually pinches off the bottom of the hole before it is completely filled.

In the recent past, this problem has been addressed by placing a relatively strong bias voltage on the workpiece (i.e., the semiconductor wafer on which the microelectronic structures are fabricated) that tends to promote metal ion trajectories that are perpendicular to the wafer surface and parallel to the axis of the high aspect ratio holes or openings. A further problem arises from the nature of the sputtered metal source, in that it tends to generate both metal ions and metal neutrals. While the ions are beneficially directed by the bias voltage on the wafer to a more perpendicular trajectory, the neutrals are not and therefore tend to deposit on the side walls of the holes, so that the problem of controlling relative rates of deposition on the side wall and bottom of a hole is not completely solved.

This latter difficulty has been addressed by increasing the proportion of metal ions in the plasma generated at the source and/or by increasing the bias voltage on the wafer. Increasing the metal ion density in the source plasma can be accomplished by magnetic confinement of the plasma near the sputtered metal target. This increase is proportional to the strength of the magnetic field used to confine the source plasma at the target, and therefore is limited by the ability to produce a strong magnetic field at the target. This approach is therefore of limited efficacy in improving metal coverage at the bottom of a high aspect ratio opening. Increasing the bias voltage on the workpiece in order to improve metal coverage at the bottom of a hole or opening is limited by the tendency to cause ion bombardment damage of the microelectronic structures on the wafer, and therefore this approach is also of limited efficacy.

The foregoing attempts to improve metal coverage at the bottom of a high aspect ratio opening are directed exclusively to solving that problem. However, even if such approaches were completely successful in solving that problem, they would still be inadequate to address current technology. This is because current microelectronic circuit technology involves sub-micron feature sizes and etched openings with aspect ratios of about ten. Current technology further involves multi-level conductor structures having long vias that must be filled by metal using fill-and-polish techniques requiring special attention not only to the coverage of the bottom surfaces of the opening but also special attention to the coverage of much deeper side walls. While an ion-rich or pure ion plasma provides best coverage of the bottom surfaces of deep narrow holes due to their generally perpendicular trajectories near the wafer surface, the neutrals tend to provide superior coverage of a side wall because of their tendency toward more oblique or non-perpendicular trajectories.

This problem occurs in processes involving copper deposition. Copper atoms deposited directly on semiconductor (silicon) surfaces or silicon dioxide layers tend to migrate out of the copper layer and into the other layer. Such migration continues over time and can ultimately lead to device failures. Therefore, copper deposition is generally preceded by deposition of a suitable barrier layer prior to deposition of copper. The barrier layer constitutes a material that tends to not migrate into the underlying layer (or any adjoining layers) and are compatible with that layer and with copper. Examples of barrier layer materials include (but are not limited to) dielectrics such as (for example) tantalum nitride, titanium nitride, etc. or conductors such as (for example) titanium or tantalum, etc. If the barrier layer is a dielectric material, then it can be advantageous to deposit a conductive seed layer (such as, for example, titanium or tantalum) over the barrier layer, and then finally depositing the copper layer.

The barrier layer and the seed layer are very thin while the copper layer fills the hole or via and therefore is relatively thick. The very thin barrier layer and seed layer present particularly difficult problems in the coverage of the side walls. Because of their thinness (relative to the copper layer that covers them), the barrier and seed layers in some cases present a lesser problem in covering high aspect ratio hole bottoms but a greater problem in covering the long and deep side walls of vias and contact openings. (Such thin layers may not present as great a risk of the pinch-off problem referred to above relating to poor metal coverage of the bottom of deep narrow holes.) In a typical example, the barrier layer is a continuous thin film of tantalum nitride that tends to be about 200 to 300 angstroms thick on horizontal surfaces and about 100 angstroms thick on vertical surfaces, and the intermediate adhesion layer is a continuous thin film of tantalum of about 100 angstroms thickness. A copper seed layer is deposited over the adhesion layer, the copper seed layer being about 1000 angstrom thick on horizontal surfaces and about 100 angstroms thick on vertical surfaces. Thereafter, a very thick copper layer is electroplated over the copper seed layer to form a fairly smooth copper surface.

Unfortunately, the problem of obtaining good side wall metal coverage has been ignored in the various techniques of the prior art. Techniques that merely enhance ion density to ensure good metal coverage at the bottom of a deep narrow hole may be unsuitable or less than optimum in current processes involving deposition of copper and underlying barrier and seed layers in high aspect ratio micron or sub-micron features. This is because the old approaches do not address the need for good side wall coverage and are directed mainly to the old problem of enhancing metal coverage at the bottom of narrow deep openings by enhancing ion density exclusively.

Therefore, what is needed is a process that is sufficiently versatile to meet the needs of current copper deposition processes involving a continuously plasma sputtered metal target and deposition of thin barrier and seed layers over long deep side walls while preserving good metal coverage of bottoms of narrow deep holes.

SUMMARY OF THE DISCLOSURE

A metal vapor deposition reactor includes a primary reactor chamber having a primary chamber enclosure comprising a ceiling and side wall. A wafer support pedestal within the primary chamber has a planar processing surface for supporting a planar semiconductor wafer. The reactor further includes a secondary reactor chamber having a secondary chamber enclosure and a metal source target within the secondary chamber formed of a metal species to be deposited on the semiconductor wafer. Process gas inlets furnish process gases into a region of the secondary chamber near a working surface of the metal source target. A D.C. power source connected across the metal source target and a conductive portion of the secondary chamber enclosure has sufficient power to support ionization of the process gas near the working surface of the metal source target whereby to form a plasma that sputters metal ions and neutrals from the working surface of the metal source target.

A plasma confinement magnet adjacent a back surface of the metal target source has one magnetic pole adjacent a central region of the back surface and a second opposite magnetic pole of annular extent surrounding the one pole and adjacent an annular region of the back surface surrounding the central region. An arcuate hollow conduit is connected between the primary and secondary chambers and has an arcuate central axis of a sufficient curvature to block straight line paths and thereby exclude neutral metal particles. A conductive coil is wrapped helically around the hollow conduit and a current source is connected across the conductive coil. The current source provides an electrical current in the coil to produce magnetic field lines so that ions drifting from the working surface of the metal source target follow the magnetic field lines to impinge generally perpendicularly on the planar semiconductor wafer.

A metal vapor deposition reactor capable of controllably varying the proportion of metal ions of perpendicular incidence and metal neutrals of distributed angles of incidence includes a reactor chamber having a primary chamber enclosure of a ceiling and side wall, with a wafer support pedestal within the primary chamber having a planar processing surface for supporting a planar semiconductor wafer. A metal source target within the chamber is formed of a metal species to be deposited on the semiconductor wafer. A process gas inlet furnishes process gas into a region of the chamber near a working surface of the metal source target. A D.C. power source connected across the metal source target and a conductive portion of the secondary chamber enclosure has sufficient power to support ionization of the process gas near the working surface of the metal source target whereby to form a plasma that sputters metal ions and neutrals from the working surface of the metal source target, some of the neutrals drifting toward the processing surface of the wafer support pedestal in random trajectories. An electromagnet establishes magnetic field lines extending along a path from the working surface of the metal source target and perpendicularly intersecting the planar processing surface of the wafer support pedestal. A variable current source connected across the electromagnet controls the strength of the magnetic field lines that determines a proportion of ions in the plasma that follow the magnetic field lines to impinge perpendicularly on the planar wafer, whereby to vary the ion flux relative to neutral flux on the wafer.

A method of operating this reactor involves setting the variable current source to a maximum level to attain maximum ion flux on the wafer in order to provide the highest flux of perpendicularly incident ions on the wafer surface, in order to achieve metal coverage of the bottom floor of a narrow deep opening. Then, in order to cover the side walls, the variable current source is reduced to a minimum level to attain the highest relative flux of angularly incident neutrals on the wafer surface in order to achieve metal coverage of the side walls.

DETAILED DESCRIPTION

Figure 1:
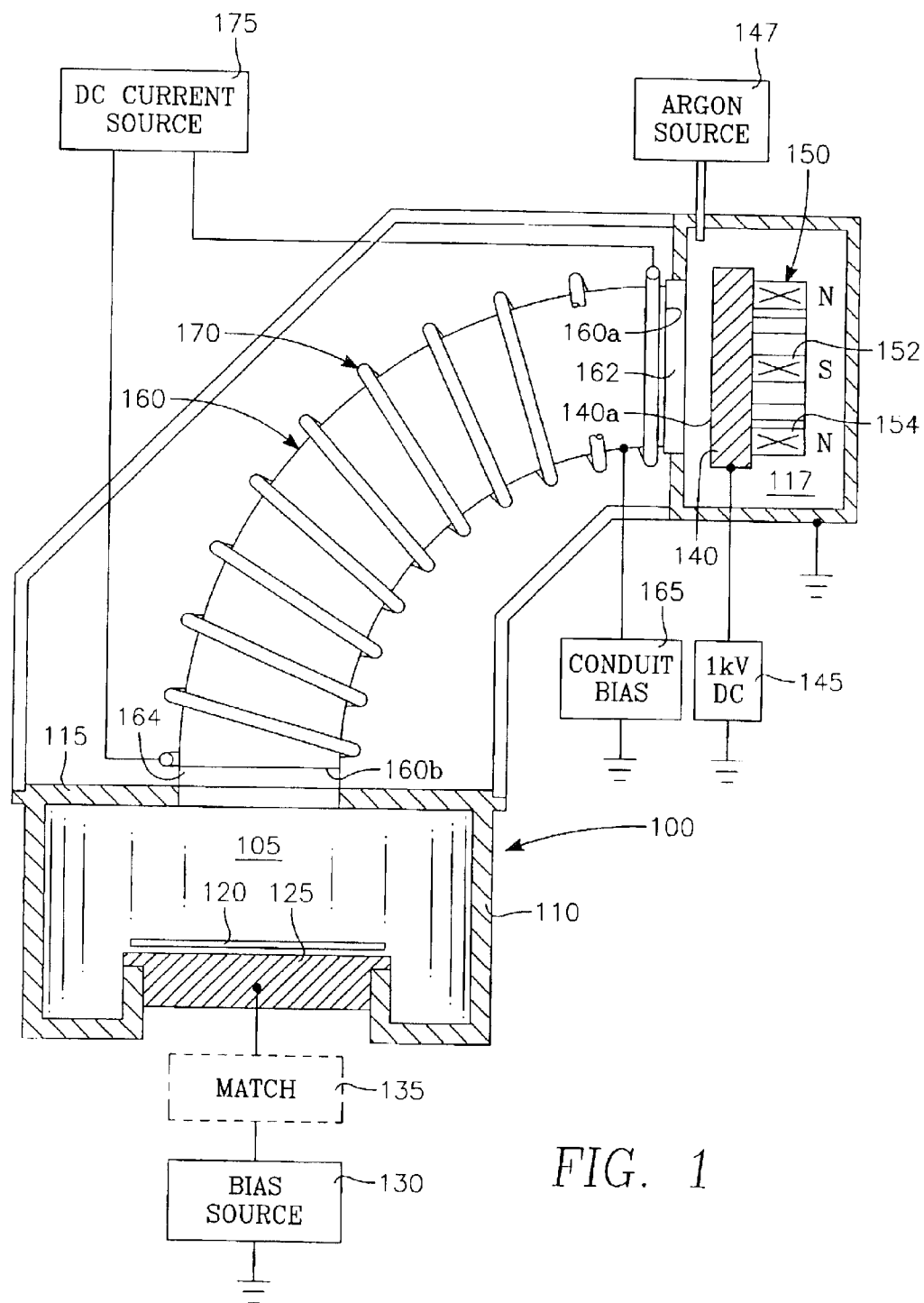
FIG. 1 illustrates a continuous source metal vapor deposition reactor having an ion enhancing/neutral rejecting filter.
Figure 2:
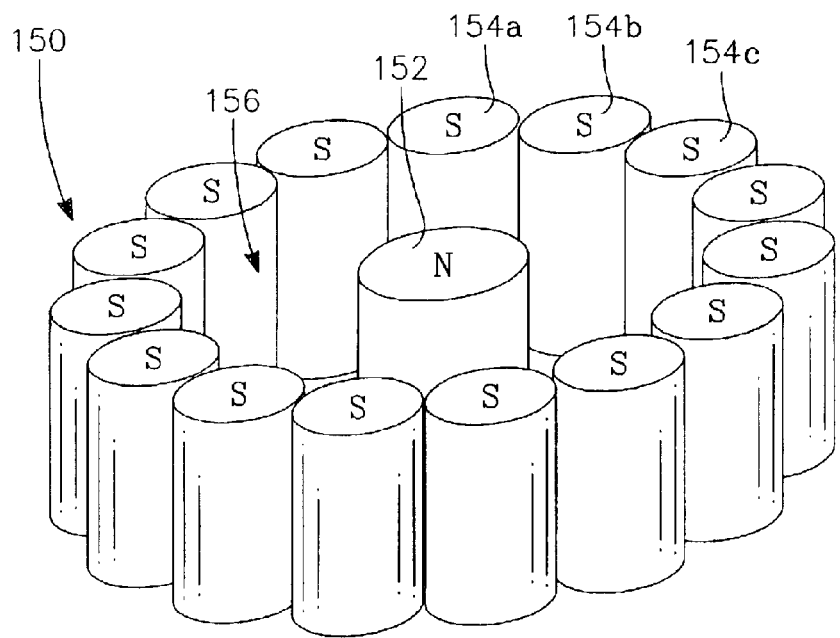
FIG. 2 illustrates a plasma confinement magnet used in the reactor of FIG. 1.

FIG. 1 illustrates a plasma reactor for carrying out a metal deposition process. The reactor includes a vacuum chamber enclosed by a reactor enclosure 100 including a lower portion 105 having a side wall 110 and a ceiling 115 and an upper portion 117. A semiconductor wafer 120 on which microelectronic thin film structures are to be fabricated is supported on a wafer support pedestal 125. An optional bias power source 130 which may be an RF generator or a D.C. voltage source is coupled to the wafer 120 through the pedestal 125. If the bias power source 130 is an RF generator, then it may be connected to the wafer support pedestal through an RF impedance match device 135. A metal sputtering target 140 is supported within the upper portion 117 of the enclosure 100. The sputtering target may be formed of a suitable metal such as copper, tantalum, titanium or aluminum, for example, depending upon the type of metal layer to be deposited. A large D.C. voltage source 145 is connected across the target 140 and the reactor enclosure 100. An optional set of gas inlets 147 near the bottom-facing surface 140a of the target 140 are connected to a supply of gas such an inert gas like Argon. The voltage of the D.C. source 145 relative to the ground potential of the reactor enclosure 100 is sufficient to ionize the argon gas introduced near the target bottom surface 140a and form an Argon plasma there. Argon ions in the plasma bombard the metal target bottom surface 140a so that metal ions and neutrals are sputtered and enter the plasma. The ratio of metal ions to metal neutral species is enhanced by ionization of metal neutrals in the plasma, which occurs at a rate proportional to plasma ion density. Plasma density near the target bottom surface 140a is enhanced (in order to enhance the overall proportion of metal ions relative to metal neutrals) by confining the plasma in the neighborhood of the target bottom surface 140a. For this purpose, a magnet 150 is provided on the top surface 140b of the target 140, the magnet 150 having a coaxial polar structure in which a central south pole 152 is surrounded by a cylindrical north pole 154 and is separated therefrom by an annular gap 156 best shown in FIG. 2. As shown in FIG. 2, the central south pole 152 is a solid cylindrical magnet having its south pole facing the target 140 and its north pole facing away from the target 140, while the cylindrical north pole is an array of discrete parallel magnets 154a, 154b, 154c, etc., arranged in a circle with their north poles facing the target 140 and their south poles facing away from the target 140. The coaxial structure of the south and north poles 152, 154 creates an annular magnetic bucket near the bottom target surface 140a generally congruent with the gap 156 between the south and north poles 152, 154, the magnetic bucket tending to confine plasma ions in a corresponding annular region near the bottom target surface 140a. For a 200 mm wafer, the annular gap 156 may be about three inches in radial extent, with the center pole 152 having a diameter of three inches and the outer pole 154 having an inner diameter of six inches.

The magnetic field strength of the magnet 150 is in the range of 100 to 500 Gauss, depending upon the degree of metal ion density enhancement desired. The magnetic field, however, is not so strong as to completely confine the plasma at the target bottom surface 140a, and instead a steady stream of plasma including both ion metal species and neutral metal species drifts away from the region near the target bottom surface 140a.

The power level of the bias source 130 is sufficient to cause metal ions drifting toward the wafer 120 to assume a trajectory perpendicular to the wafer surface. This feature ensures that such metal ions generally travel down the entire depth of a narrow deep opening in the thin film structure of the wafer surface rather than impinging upon the side wall of the opening. This ensures good metal coverage at the bottom of the hole and avoids accumulation of metal on the side wall of such an opening. Such side wall accumulation could pinch off the opening and prevent complete metal filling of the opening. Unfortunately, neutral metal species are not affected by the bias power, and therefore will have random trajectories and will accumulate on the opening side wall. In order to remove such neutrals from the plasma stream reaching the wafer surface, a curved hollow conduit 160 is provided having a top end 160a facing the target bottom surface 140a and connected to an opening in the enclosure of the upper chamber portion 117, and a bottom end 160b facing the wafer 120 and connected to an opening in the ceiling 115 of the lower chamber portion 105. The diameter of the hollow conduit 160 and the openings to the upper chamber portion 117 and in the ceiling 115 of the lower chamber portion to which the respective ends of the conduit 160 are connected may all be of the same or similar diameter, and this common diameter may be the same as or similar to the diameter of the wafer 120 or the wafer support pedestal 125. The conduit 160 may be formed of a conductive material and have a bias voltage applied to it from a conduit bias source 165. The conduit bias voltage may be positive in order to deter ions from impinging on the conduit surface. Insulator rings 162, 164 may be placed on the top and bottom ends 160a, 160b, respectively, to insulate the conduit from the conductive enclosures of the upper and lower chamber portions 105, 117. The axial curvature of the conduit 160 is sufficient to prevent any particles drifting away from the target 140 (such as neutral particles) from reaching the wafer 120. In order to ensure that metal ions can follow the curve of the conduit 160 and reach the wafer 120, a current-carrying coil 170 is wrapped around the circuit 160 and a D.C. current source 175 applies a current to the coil 170 to produce magnetic field lines that follow the curve of the conduit 160. The ions drifting away from the surface of the target 140 follow the magnetic field lines and therefore are generally the only particles from the target 140 that reach the wafer 120. The curvature of the conduit 160 is such that uncharged particles incapable of following the magnetic field lines cannot reach the wafer surface. The result is that a continuous nearly pure ion source is provided so that nearly all metal species reaching the wafer surface are pulled by the bias power on the wafer 120 into a perpendicular trajectory relative to the wafer surface. Such a perpendicular trajectory ensures that the metal ions reach the bottom of each narrow deep opening rather than accumulating on side walls.

Figure 4:
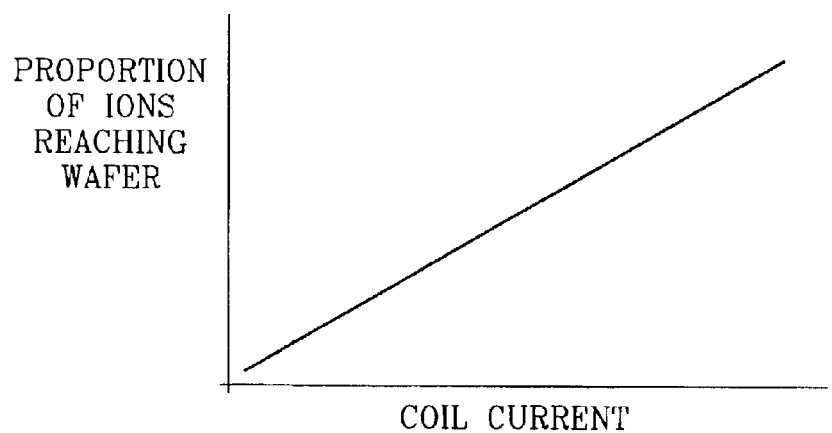
FIG. 4 depicts behavior of ion flux with the control feature of FIG. 3.
Figure 3:
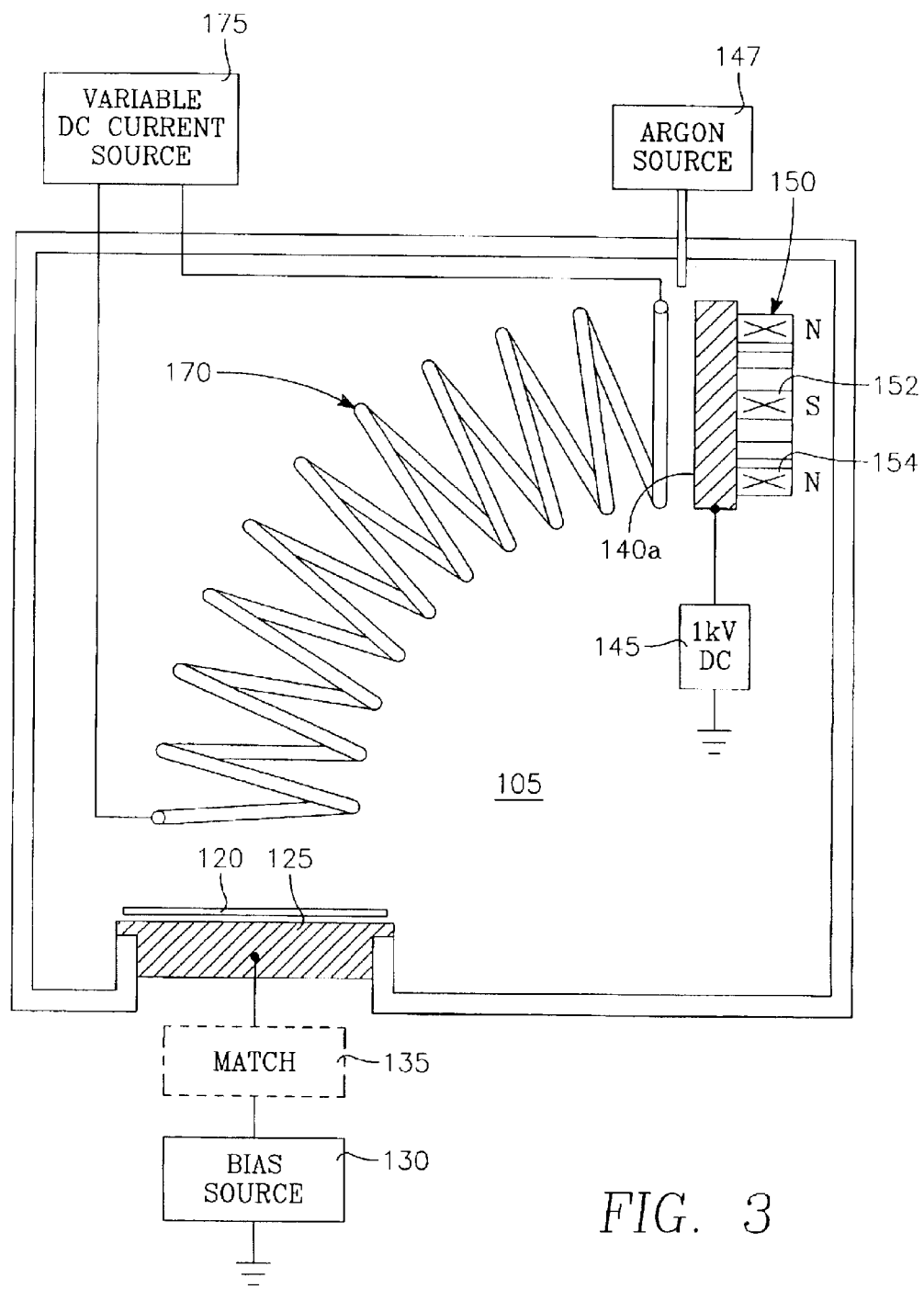
FIG. 3 illustrates a continuous source metal vapor deposition reactor with variable ion flux at the workpiece surface relative to neutral flux.
Figure 5A:
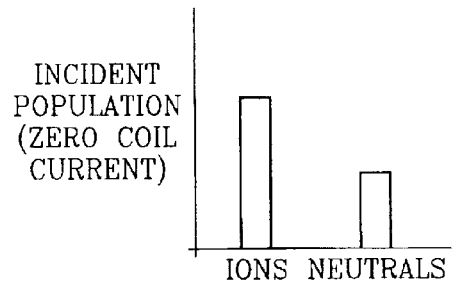
FIGS. 5A and 5B illustrate, respectively, the relative ion and neutral flux densities and the ion and neutral trajectories from the target for zero coil current.
Figure 5B:
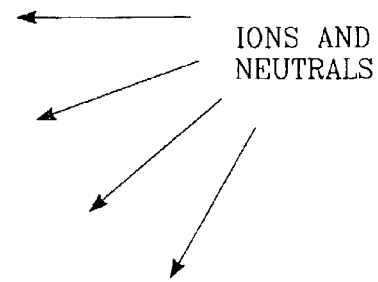
Figure 6A:
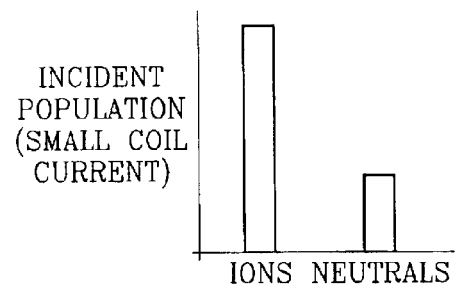
FIGS. 6A and 6B illustrate, respectively, the relative ion and neutral flux densities and the ion and neutral trajectories from the target for medium coil current.
Figure 6B:
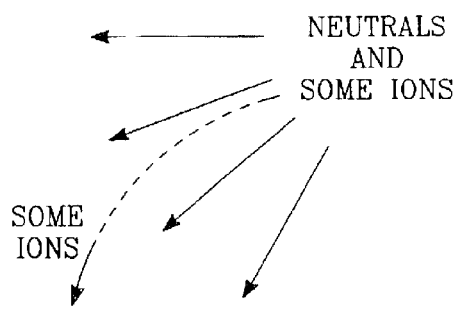
Figure 7A:
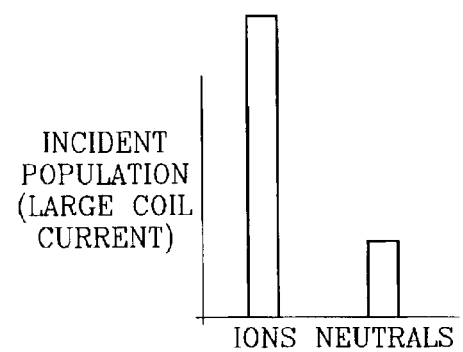
FIGS. 7A and 7B illustrate, respectively, the relative ion and neutral flux densities and the ion and neutral trajectories from the target for maximum coil current.
Figure 7B:
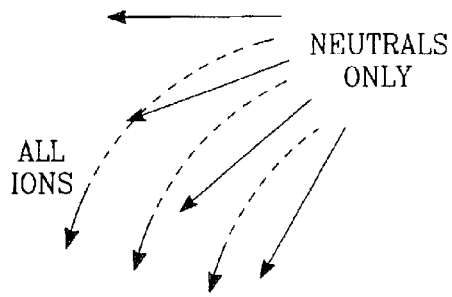

FIG. 3 illustrates how the metal target 140 may be located within the main portion 105 of the chamber (so that the upper portion 117 can be eliminated), and the conduit 160 may be eliminated while retaining the curved coil 160. In this case, some of the metal neutrals from the target 140 can directly reach the wafer 120. The flux of ions however is now controllable by the user through the expedient of varying the D.C. current source 175 that controls the magnetic field lines followed by the ions. If there is no magnetic field, the ion flux at the wafer surface is minimum because trajectories of ions created at the target bottom surface 140a are random. If the magnetic field is increased (by increasing the coil current from the source 175), then the ion flux at the wafer surface increases as more and more ions follow the magnetic field lines pointing toward the wafer surface. This concept is depicted in the graph of FIG. 4, which indicates that the ion content of plasma incident on the wafer increases as the coil current increases. This behavior is depicted in the sequence of FIGS. 5, 6 and 7. FIG. 5A is a graph depicting an exemplary population distribution of metal ions and metal neutrals at the wafer surface for a zero or minimal coil current. FIG. 5B illustrates the random trajectories of the ions and neutrals at this low coil current. With zero coil current, there is nothing to change the random trajectories of the ions emanating from the bottom target surface 140a, so that their trajectories are as random as the trajectories of the neutral metal species. Therefore, the population distribution of ions and neutrals at the wafer surface depicted in FIG. 5A reflects the ion and neutral densities in the plasma at the target bottom surface 140a. In FIG. 6A, the coil current is increased to a small value and the ion population at the wafer surface increases relative to the neutral population. This is because, as depicted in FIG. 6B, the small coil current produces a weak magnetic field having field lines which a proportionately small number of the ions follow to impinge perpendicularly on the wafer surface. The neutral flux remains unchanged by changes in the coil current and is therefore the same in both FIGS. 5A and 6A. As the coil current is increased to a large value, the magnetic field becomes stronger so that generally all of the ions emanating from the target bottom surface 140a follow the curved magnetic field lines down to the wafer surface. Therefore, FIG. 7A indicates that the ion flux at the wafer surface greatly exceeds the neutral flux. FIG. 7B shows that all of the ions follow the curved magnetic field lines of the strong magnetic field down to the wafer surface while the neutral trajectories are unchanged from those illustrated in FIGS. 5B and 6B.

From the foregoing, it can be seen that the zero or minimal coil current (FIGS. 5A and 5B) produces the maximum neutral flux at the wafer surface, which may be ideal in some cases requiring excellent metal coverage of side walls. The medium coil current (FIGS. 6A and 6B) produces more ion flux relative to the neutral flux, which may be ideal for filling an opening with metal after bottom and side wall metal coverage has been completed. The maximum coil current (FIGS. 7A and 7B) produces maximum ion flux relative to neutral flux, which is ideal for providing excellent metal coverage at the bottom of a deep narrow opening. The variable D.C. current source 175 may include control circuitry for controlling the RF wafer bias source 130 in cooperation with the coil current, so that the bias is active when a significant ion flux to the wafer is selected and need not be active if only neutrals are directed to the wafer 120.

Figure 8:
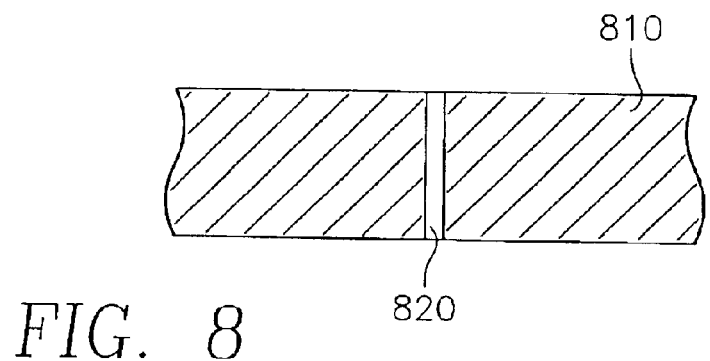
FIGS. 8 and 9 illustrate various microelectronic thin film structures on the wafer that can be formed with the reactors described in this specification.
Figure 9:
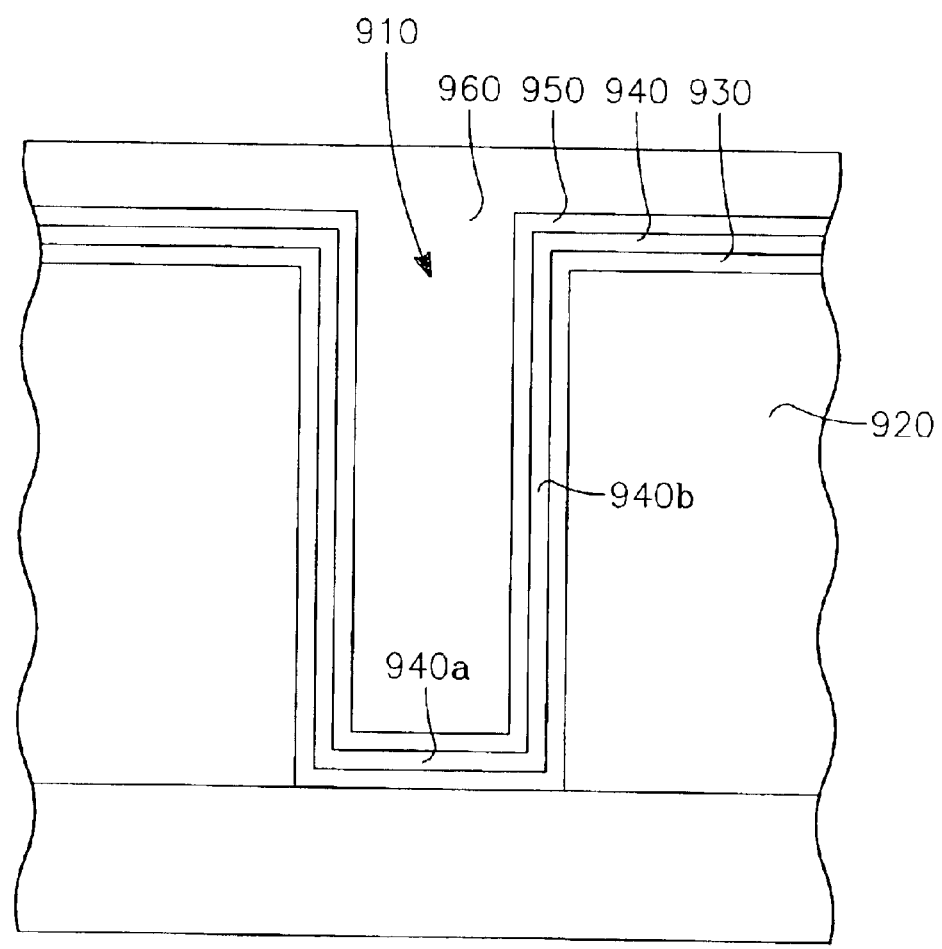

FIG. 8 illustrates a cut-away side view of a microelectronic thin film structure in which a silicon dioxide layer 810 has a narrow deep contact opening 820 formed vertically there through. The diameter of the opening 820 may be between 0.1 and 0.2 microns while the depth of the opening 820 may be about 10 microns, for example. FIG. 9 illustrates a thin film microelectronic structure in which a contact opening 910 through a silicon dioxide layer 920 is to be filled with copper. However, prior to the deposition of copper, a barrier layer 930 of tantalum nitride must be deposited first in order to block migration of copper atoms through the silicon dioxide or underlying layer. Then a metallic seed layer 940 such as tantalum is deposited over the barrier layer 930. Finally, a copper layer 950 is deposited over the seed layer 940. Thereafter, an electroplating process can be employed in filling out the entire opening with a thick copper layer 960. Each of the metal layers 940, 950 is thin and is deposited by the metal vapor deposition reactor of the type illustrated in FIG. 1 or FIG. 3. For the step of depositing the tantalum seed layer 940, the target 140 is tantalum. For the step of depositing the copper layer 950, the target 140 is copper.

For deposition of the thin tantalum layer 940, the horizontal bottom portion 940a must be deposited before formation of the vertical portion 940b. Therefore, the first phase of this process (block 1010 of FIG. 10) involves maximum tantalum ion flux so that almost all tantalum atoms impinge vertically under the influence of the magnetic field and/or the bias voltage on the wafer. Therefore, this first phase involves maximum coil current, corresponding to FIGS. 7A and 7B. After the bottom layer 940a is complete, the vertical side wall layer 940b is formed by providing an appropriate mix of neutral tantalum atoms with tantalum ions (block 1020 of FIG. 10). The neutrals in this mix tends to have somewhat non-perpendicular trajectories, and therefore tend to provide excellent coverage of the side wall portion 940b. Therefore, this second phase is carried out with a minimal or zero coil current, corresponding to FIGS. 5A and 5B. Finally, an overall thickening of both the horizontal and vertical portions 940a, 940b can be carried out with a plasma having a modest proportion of neutral tantalum atoms, so that a medium coil current may be employed, corresponding to FIGS. 6A and 6B (block 1030 of FIG. 10). FIG. 11 illustrates the coil current as a function of time over the three steps of FIG. 10. The first step or phase consists of forming the horizontal bottom layer 940a, during which the coil current is set to a maximum level. The second step consists of forming the vertical layer 940b, during which the coil current is set to a minimum level. The third (optional) step is a general thickening of the two layers 940a, 940b, during which the coil current is set to a medium level.

Deposition of the copper layer 950 is carried out in the same multi-step manner as described above for the tantalum layer 940 after the target 140 has been changed from tantalum to copper. Thus, the steps of FIG. 10 are repeated after the tantalum target has been replaced by a copper target.

Figure 12:
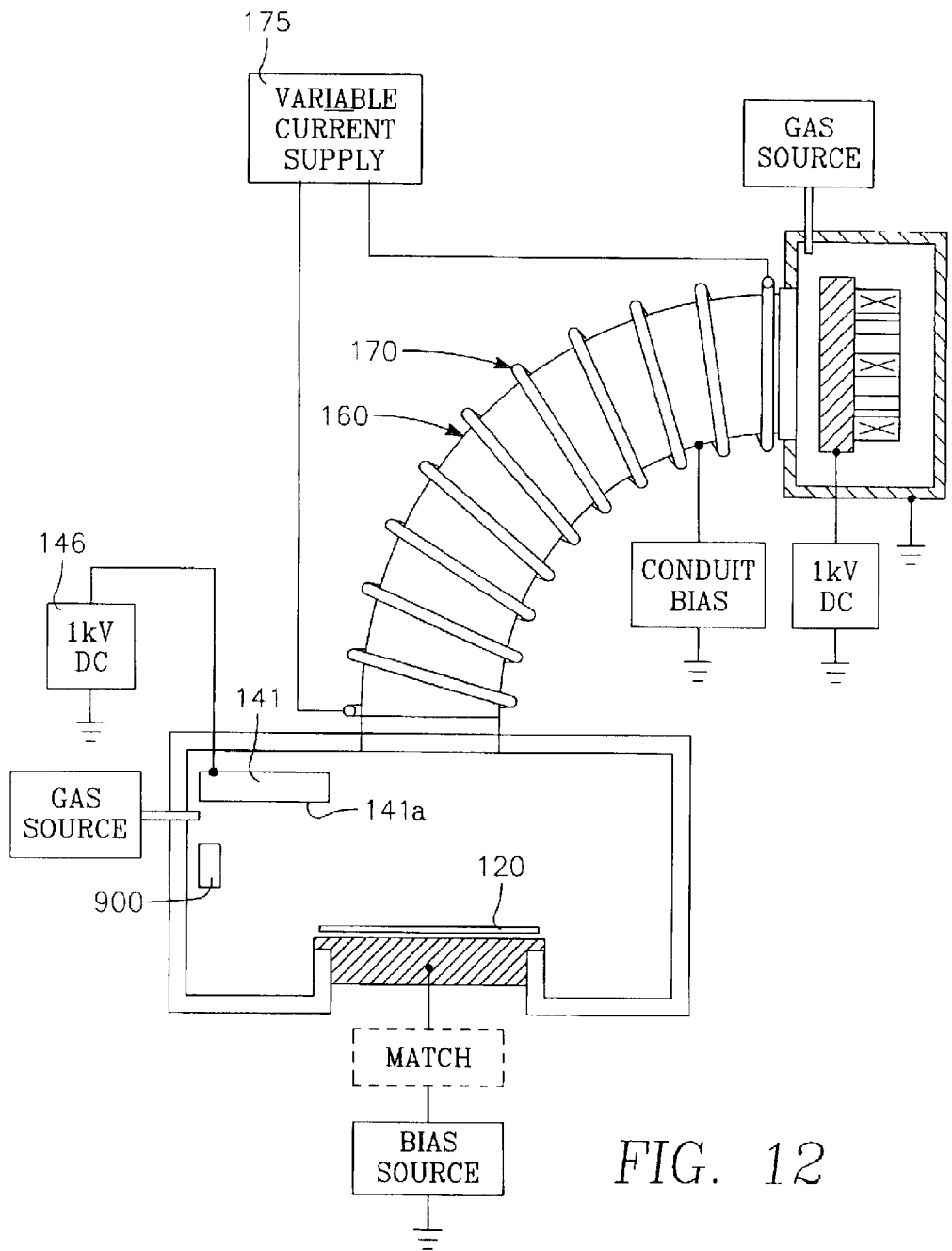
FIG. 12 illustrates a continuous source metal vapor deposition reactor having variable ion flux and variable neutral flux at the wafer surface.

FIG. 12 illustrates a metal deposition reactor in which a greater range of neutral and ion flux densities can be attained. In the reactor of FIG. 12, the plasma incident on the wafer surface can be varied between a nearly pure ion content to a nearly pure neutral content, for greater process control. The reactor of FIG. 12 is nearly identical to the reactor of FIG. 1, except that the coil current source 175 is variable as in FIG. 3, and an additional element is present, namely a second metal target 141 connected to a second power source 146, with a second gas inlet providing (for example) argon gas near the second target bottom surface 141a. The purpose of the second target 141 is to provide a nearly pure neutral source, and therefore no coil or conduit (like the coil 170 and conduit 160) is associated with the neutral source target 141. In order to remove ions from the plasma stream emanating from the second target 141, an optional ion deflection magnet 900 may be provided that deflects ions emanating from the second target bottom surface 141a into a curved path leading away from the wafer 120. (The ion deflection magnet 900 is sufficiently removed from the path of the ions from the ion source target 141 so as to not deflect those ions.) In the reactor of FIG. 12, ion flux at the wafer surface can be varied from zero to a maximum value by varying the coil current from the coil current source 175 between zero and a maximum value. At the same time, neutral flux at the wafer surface can be varied between zero and a maximum value by varying the voltage of the neutral target power source 146 between zero and a maximum voltage (e.g., one kilovolt).

Figure 10:
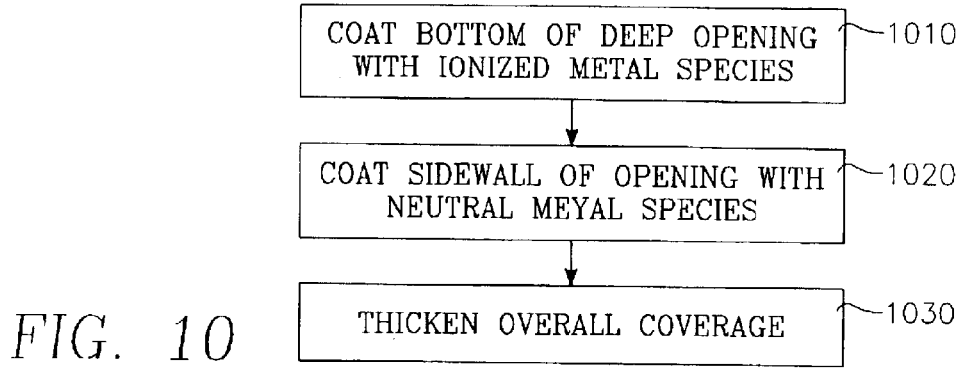
FIG. 10 is a flow chart representing a process that can be carried out in the reactor of FIG. 3.
Figure 11:
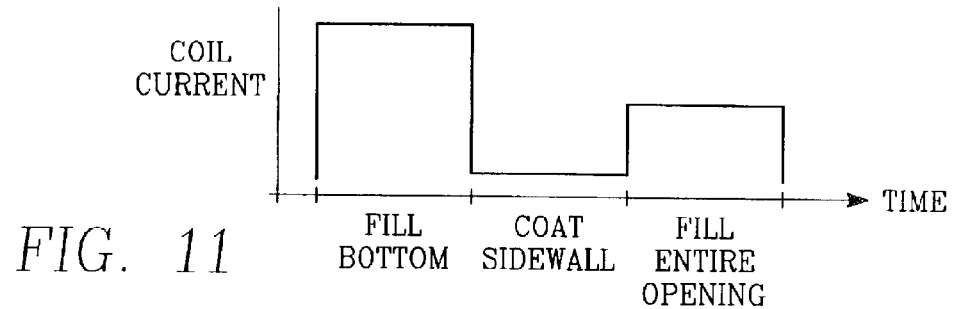
FIG. 11 is a timing diagram of the coil current corresponding to the process of FIG. 10.
Figure 13A:
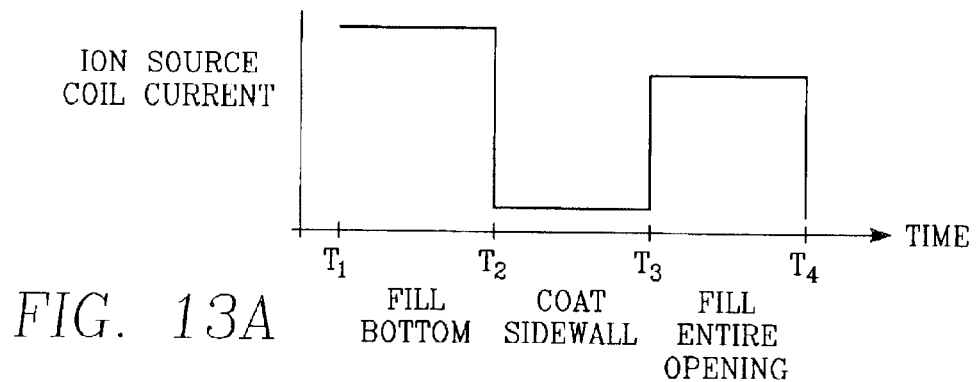
FIGS. 13A and 13B are contemporaneous timing diagrams illustrating the simultaneous operation of the ion and neutral sources in carrying out a multi step metal deposition process corresponding to that of FIG. 10 using the reactor of FIG. 12.
Figure 13B:
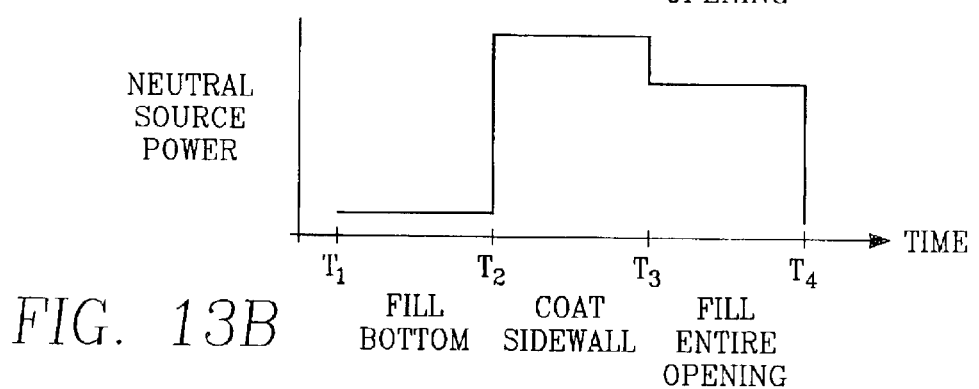

FIGS. 13A and 13B are contemporaneous timing diagrams illustrating the simultaneous control of the ion source coil current (by the variable D.C. coil current source 175) and of the neutral source variable power supply 146 during the three steps of FIG. 10 as carried out in the reactor of FIG. 12. The first step (from time t1 to time t2) requires an ion-rich plasma at the wafer surface to form the horizontal layer (e.g., the horizontal layer 940a). Therefore, during this first step the ion source coil current is maximum and the neutral source power level is minimum or zero. The next step (from time t2 to time t3) requires a neutral-rich plasma at the wafer surface to form the vertical layer (e.g., the vertical layer 940*b*). Therefore, during this second step the ion source coil current is minimum or zero while the neutral source power level is maximum. Finally, during the third step (from time t3 to time t4) the entire layer is thickened so that a mixture of ions and neutrals is provided at the wafer surface, requiring a both a significant neutral source power level and a significant ion source coil current.

While the invention has been described in detail by specific reference to preferred embodiments, it is understood that variations and modifications thereof may be made without departing from the true spirit and scope of the invention.

What is claimed is:

1. A metal vapor deposition reactor comprising:
   a primary reactor chamber having a primary chamber enclosure comprising a ceiling and side wall;
   a wafer support pedestal within said primary chamber having a planar processing surface for supporting a planar semiconductor wafer;
   a secondary reactor chamber having a secondary chamber enclosure;
   a metal source target within said secondary chamber comprising a metal species to be deposited on said semiconductor wafer;
   a process gas inlet for furnishing process gas into a region of said secondary chamber near a working surface of said metal source target;
   a D.C. power source connected across said metal source target and a conductive portion of said secondary chamber enclosure, said D.C. power source having sufficient power to support ionization of said process gas near said working surface of said metal source target whereby to form a plasma that sputters metal ions and neutrals from said working surface of said metal source target;
   a plasma confinement magnet adjacent a back surface of said metal target source opposite said working surface, said plasma confinement magnet comprising one magnetic pole adjacent a central region of said back surface and a second opposite magnetic pole of annular extent surrounding said one pole and adjacent an annular region of said back surface surrounding said central region;
   a primary opening in said primary chamber enclosure facing said planar process surface of said wafer support pedestal;
   a secondary opening in said secondary chamber enclosure facing said working surface of said metal source target;
   an arcuate hollow conduit having a first open end connected to said primary opening and a second open end connected to said secondary opening, whereby said primary and secondary chambers are connected via said arcuate hollow conduit, said hollow conduit having an arcuate central axis of a sufficient curvature to block straight line paths between said first and second ends;
   a conductive coil wrapped helically around said hollow conduit and having a central axis generally coinciding with said arcuate central axis of said hollow conduit; and
   a current source connected across said conductive coil, said current source providing an electrical current in said coil to produce magnetic field lines parallel to said arcuate central axis of sufficient strength so that ions drifting from said working surface of said metal source target follow said magnetic field lines to impinge generally perpendicularly on said planar semiconductor wafer.

2. The reactor of claim 1 wherein said arcuate hollow conduit is formed of a conductive material, said reactor further comprising:
   a bias voltage source connected across said conduit and at least one of said primary and secondary enclosures, whereby to repel ions from an interior surface of said conduit.

3. The reactor of claim 2 further comprising first and second insulators adjacent said first and second openings, respectively, for isolating said conduit from said primary and secondary enclosures.

4. The reactor of claim 3 further comprising:
   a wafer bias voltage source connected across said wafer support pedestal and said primary chamber enclosure.

5. The reactor of claim 4 wherein said metal source target comprises one of (a) copper, (b) tantalum, (c) titanium, (d) aluminum.

6. A metal vapor deposition reactor comprising:
   a reactor chamber having a primary chamber enclosure comprising a ceiling and side wall;
   a wafer support pedestal within said primary chamber having a planar processing surface for supporting a planar semiconductor wafer;
   a secondary reactor chamber having a secondary chamber enclosure;
   a metal source target within said chamber comprising a metal species to be deposited on said semiconductor wafer;
   a process gas inlet for furnishing process gas into a region of said secondary chamber near a working surface of said metal source target;
   a D.C. power source connected across said metal source target and a conductive portion of said secondary chamber enclosure, said D.C. power source having sufficient power to support ionization of said process gas near said working surface of said metal source target whereby to form a plasma that sputters metal ions and neutrals from said working surface of said metal source target, some of said neutrals drifting toward said working surface of said wafer support pedestal in random trajectories;
   an electromagnet establishing magnetic field lines extending along a path from said working surface of said metal source target and perpendicularly intersecting said planar processing surface of said wafer support pedestal;
   a variable current source connected across said electromagnet, said current source controlling a strength of said magnetic field lines that determines a proportion of ions in said plasma following said magnetic field lines from said metal source target toward said working surface to impinge perpendicularly on said planar wafer, whereby to vary the ion flux relative to neutral flux near said wafer; and
   wherein said magnetic field lines of said electromagnet define an arcuate path.

7. The reactor of claim 6 further comprising:
   a plasma confinement magnet adjacent a back surface of said metal target source opposite said working surface, said plasma confinement magnet comprising one magnetic pole adjacent a central region of said back surface and a second opposite magnetic pole of annular extent surrounding said one pole and adjacent an annular region of said back surface surrounding said central region.

8. The reactor of claim 7 further comprising:
a wafer bias voltage source connected across said wafer support pedestal and said primary chamber enclosure.

9. The reactor of claim 8 wherein said metal source target comprises one of (a) copper, (b) tantalum, (c) titanium, (d) aluminum.

10. A metal vapor deposition reactor comprising:
a primary reactor chamber having a primary chamber enclosure comprising a ceiling and side wall;
a wafer support pedestal within said primary chamber having a planar processing surface for supporting a planar semiconductor wafer;
a secondary reactor chamber having a secondary chamber enclosure;
a metal neutral source target within said primary chamber comprising a metal species to be deposited on said semiconductor wafer;
a metal ion source target within said secondary chamber comprising said metal species;
a process gas inlets for furnishing process gases into regions of said primary and secondary chambers near working surfaces of said ion and neutral metal source targets, respectively;
a D.C. ionization power source connected across said metal ion source target and a conductive portion of said secondary chamber enclosure;
a variable D.C. ionization power source connected across said metal neutral source target and said primary chamber enclosure, said variable D.C. power source controlling a variable ion flux near said processing surface of said wafer support;
a plasma confinement magnet adjacent a back surface of said metal ion source target opposite said working surface, said plasma confinement magnet comprising one magnetic pole adjacent a central region of said back surface and a second opposite magnetic pole of annular extent surrounding said one pole and adjacent an annular region of said back surface surrounding said central region;
a primary opening in said primary chamber enclosure facing said planar process surface of said wafer support pedestal;
an secondary opening in said secondary chamber enclosure facing said working surface of said metal ion source target;
an arcuate hollow conduit having a first open end connected to said primary opening and a second open end connected to said secondary opening, whereby said primary and secondary chambers are connected via said arcuate hollow conduit, said hollow conduit having an arcuate central axis of a sufficient curvature block straight line paths between said first and second ends;
a conductive coil wrapped helically around said hollow conduit and having a central axis generally coinciding with said arcuate central axis of said hollow conduit; and
a variable current source connected across said conductive coil, said current source controlling a strength of said magnetic field lines that determines a proportion of ions in said plasma following said magnetic field lines from said metal source target toward said working surface to impinge perpendicularly on said planar wafer, whereby to vary the ion flux relative to neutral flux near said wafer.

11. The reactor of claim 10 further comprising an ion diversion magnet in said primary chamber for diverting metal ions generated at said neutral metal source target away from said processing surface of said wafer support pedestal.

12. The reactor of claim 10 wherein said arcuate hollow conduit is formed of a conductive material, said reactor further comprising:
a bias voltage source connected across said conduit and at least one of said primary and secondary enclosures, whereby to repel ions from an interior surface of said conduit.

13. The reactor of claim 12 further comprising first and second insulators adjacent said first and second openings, respectively, for isolating said conduit from said primary and secondary enclosures.

14. The reactor of claim 13 further comprising:
a wafer bias voltage source connected across said wafer support pedestal and said primary chamber enclosure.

15. The reactor of claim 10 wherein said metal source target comprises one of (a) copper, (b) tantalum, (c) titanium, (d) aluminum.

16. A method of depositing a metal film onto a thin film microelectronic structure on a surface of a semiconductor wafer including vertically deep and horizontally narrow openings having horizontally spanning bottom surfaces and vertical side walls, said method comprising:
providing in a chamber a plasma sputtered metal target source of metal ions and metal neutrals;
supporting said semiconductor wafer in a location within said chamber that receives a neutral flux of said metal neutrals from said target source and an ion flux of said metal ions from said target source;
providing an electromagnet filter controlled by an applied current for enhancing a flux of perpendicularly incident ions on said surface of said semiconductor wafer;
forming a metal layer over said bottom surfaces by setting said applied current to a maximum value so as to produce a maximum flux of perpendicularly incident metal ions on said wafer surface with minimal incidence on said side walls;
forming a metal layer over said side walls by setting said applied current to a minimum value so as to produce a maximum proportion of randomly incident metal neutrals on said wafer surface with maximum incidence on said side walls.

17. The method of claim 16 further comprising:
varying said applied current in accordance with a desired proportion between a side wall deposition rate and a bottom deposition rate in the deep narrow openings.

18. The method of claim 16 further comprising enhancing the perpendicular path of said flux of ions by applying a bias potential to said wafer.

19. The method of claim 18, wherein said electromagnetic field is provided by a helical coil enclosing said arcuate path.

20. A method of depositing a metal film onto a thin film microelectronic structure on a surface of a semiconductor wafer including vertically deep and horizontally narrow high aspect ratio openings having horizontally spanning bottom surfaces and vertical side walls, said method comprising:
supporting said semiconductor wafer within a chamber;
providing a plasma sputtered metal target source of metal ions;
providing an arcuate hollow conduit defining a curved path extending axially within said conduit from said metal target source to said semiconductor wafer and perpendicularly intersecting said semiconductor wafer, said curve path generally excluding straight paths between said metal ion target and said wafer;

generating magnetic field lines along said path in accordance with a controllable electric current determining a strength of said magnetic field lines, so as to attract said metal ions from said metal ion target to impinge perpendicularly on said wafer;

providing a plasma sputtered metal target source of metal neutrals within said chamber to generate a neutral flux at said wafer, and a controllably variable neutral target plasma power source coupled thereto for controlling neutral flux density on said wafer;

forming a metal layer over said bottom surfaces by setting said controllable electric current to a maximum value and said neutral target plasma power source to a minimum power level, said so as to produce a maximum flux of perpendicularly incident metal ions and a minimal flux of metal neutrals on said wafer surface with minimal incidence on said side walls;

forming a metal layer over said side walls by setting said controllable electric current to a minimum value and said neutral target plasma power source to a maximum level so as to produce a maximum flux of randomly incident metal neutrals and a minimal flux of metal ions on said wafer with maximum incidence on said side walls.

21. The method of claim 20 further comprising magnetically diverting metal ions produced from said metal neutral target source away from said wafer.

22. The method of claim 20 further comprising:

varying said applied current in accordance with a desired proportion between a side wall deposition rate and a bottom deposition rate in the deep narrow openings.

23. A method of processing a substrate within a plasma sputter reactor having a metal target and a substrate support to deposit a film onto a substrate surface provided with holes having a high aspect ratio and defining sidewalls and bottom surfaces, the method comprising:

sputtering species from the target using intersecting magnetic and electric fields so as to provide both ions and neutral species within the reactor adjacent the target;

providing a hollow arcuate path between the target and substrate support wherein the arcuate path generally excludes straight paths between target and substrate support;

imposing an electromagnetic field on the arcuate path;

varying the strength of said electromagnetic field between:

(A) a first value enabling a high level of ions relative to neutral species to move along said arcuate path to impinge generally perpendicularly upon said holes and preferentially deposit on said bottom surfaces, and (B) a second value inhibiting movement of ions along said arcuate path, so as to enable deposition preferentially by neutral species.

24. The method of claim 23 further comprising biasing the substrate support while the electromagnetic field is operated at said first level.

25. A plasma metal sputter reactor comprising:

a reactor chamber adapted to accept process gas to maintain a subatmospheric plasma processing environment and defining a first processing space, a second processing space, and an hollow arcuate passage joining said first and second processing spaces;

said arcuate passage having a sufficient curvature to preclude straight line paths between said first and second processing spaces;

a metal target defining a wall of said first processing space opposite said hollow arcuate passage, and mounted so as to accept an electrical potential differing from other portions of the chamber;

a substrate support defining a wall of said second processing space opposite said hollow arcuate passage and mounted so as to electrically biased at an electrical potential differing from other portions of the chamber a plasma confinement magnet assembly adjacent said target outside of said first processing space and adapted upon electrical biasing of the target to cause a sputter reaction providing both ions comprising said metal and neutral species comprising said metal within the first processing space;

a coil wound about said arcuate passage and adapted to produce a magnetic field upon being provided with an electric current; and a control to vary the electrical current in the coil between a value enabling a preselected high level of said ions relative to said neutrals to follow said arcuate passage and into said second processing space, and another level during which movement of said ions along said arcuate passage relative to neutrals is not favored.

26. The apparatus of claim 25 wherein the control biases the substrate support when the electrical signal is at a value enabling ions to follow the arcuate passage.

27. The reactor of claim 25 wherein the diameters of the arcuate passage and the substrate support are similar.

28. The reactor of claim 27 wherein the diameters of the target and passage are similar.

29. The reactor of claim 25 wherein the arcuate passage is generally symmetrical about a central axis.

30. The reactor of claim 25 wherein an electrical current in the coil enables said ions to travel generally perpendicularly to the substrate support in the vicinity thereof.

* * * * *